United States Patent [19]

Hofmann et al.

[11] Patent Number: 4,935,330

[45] Date of Patent: Jun. 19, 1990

[54] PHOTOPOLYMERIZABLE MIXTURE, PHOTOSENSITIVE RECORDING ELEMENT CONTAINING THIS MIXTURE, AND THE PRODUCTION OF LITHOGRAPHIC PRINTING PLATE USING THIS PHOTOSENSITIVE RECORDING ELEMENT

[75] Inventors: Gerhard Hofmann, Otterstadt; Reiner Hoffman, Neustadt; Harald Lauke, Mannheim; Wilhelm Weber, Neustadt; Reinhold J. Leyrer, Ludwigshafen, all of Fed. Rep. of Germany

[73] Assignee: BASF Aktiengesellschaft, Ludwigshafen, Fed. Rep. of Germany

[21] Appl. No.: 436,937

[22] Filed: Nov. 14, 1989

Related U.S. Application Data

[63] Continuation of Ser. No. 271,335, Nov. 10, 1988, abandoned, which is a continuation of Ser. No. 61,859, Feb. 20, 1987, abandoned.

[30] Foreign Application Priority Data

Feb. 26, 1986 [DE] Fed. Rep. of Germany ....... 3606155

[51] Int. Cl.$^5$ ................................................ G03C 1/76
[52] U.S. Cl. .................................... 430/281; 430/920; 430/922; 430/924; 522/14; 522/16; 522/28
[58] Field of Search ............... 430/281, 920, 922, 924; 522/14, 16, 28

[56] References Cited

U.S. PATENT DOCUMENTS

| | | |
|---|---|---|
| 3,427,161 | 2/1969 | Laridon et al. . |
| 3,558,322 | 1/1971 | Fan . |
| 3,641,110 | 2/1972 | Bence . |
| 3,708,587 | 1/1973 | Bencze . |
| 3,708,589 | 1/1973 | Bencze . |
| 3,709,993 | 1/1973 | Bencze . |
| 3,725,064 | 4/1973 | Field et al. . |
| 3,759,087 | 9/1973 | Iwao et al. . |
| 3,926,643 | 12/1975 | Chang ................................. 430/924 |
| 3,954,475 | 5/1976 | Bonham et al. . |
| 3,987,037 | 10/1976 | Bonham et al. . |
| 4,239,850 | 12/1980 | Kita et al. . |
| 4,258,123 | 3/1981 | Nagashima et al. . |
| 4,259,432 | 3/1981 | Kondoh et al. . |
| 4,320,189 | 3/1982 | Taguchi et al. ...................... 430/920 |
| 4,367,324 | 1/1983 | Zweifel et al. . |
| 4,450,279 | 5/1984 | Shirosaki et al. . |
| 4,481,276 | 11/1984 | Ishikawa et al. .................... 430/922 |
| 4,505,794 | 3/1985 | Kuita et al. ......................... 430/922 |
| 4,535,052 | 8/1985 | Anderson et al. . |
| 4,584,260 | 4/1986 | Iwasaki et al. . |
| 4,661,434 | 4/1987 | Iwasaki et al. ...................... 430/920 |

FOREIGN PATENT DOCUMENTS

| | | |
|---|---|---|
| 033721 | 6/1979 | European Pat. Off. . |
| 2934758 | 3/1973 | Fed. Rep. of Germany . |
| 2003122 | 3/1979 | Fed. Rep. of Germany . |
| 2811755 | 3/1980 | Fed. Rep. of Germany . |
| 1522359 | 3/1981 | Fed. Rep. of Germany . |
| 2122036 | 10/1982 | Fed. Rep. of Germany . |
| 3037521 | 1/1985 | Fed. Rep. of Germany . |
| 2083832 | 7/1981 | United Kingdom . |

OTHER PUBLICATIONS

Photographic Sci. Eng. 23, (1979), 137–140.

*Primary Examiner*—Jack P. Brammer
*Attorney, Agent, or Firm*—Keil & Weinkauf

[57] ABSTRACT

A photopolymerizable mixture containing one or more ethylenically unsaturated, photopolymerizable or photocrosslinkable compounds and a photopolymerization initiator which comprises a combination of an aromatic carbonyl compound of the type stated in claim 1 and an s-triazine compound containing one or more halogen-substituted methyl groups, photosensitive recording elements which possess a photopolymerizable recording layer consisting of these photopolymerizable mixtures, and a process for the production of lithographic printing plates using these recording elements.

23 Claims, No Drawings

PHOTOPOLYMERIZABLE MIXTURE, PHOTOSENSITIVE RECORDING ELEMENT CONTAINING THIS MIXTURE, AND THE PRODUCTION OF LITHOGRAPHIC PRINTING PLATE USING THIS PHOTOSENSITIVE RECORDING ELEMENT

This application is a continuation of application Ser. No. 271,335, filed on Nov. 10, 1988, now abandoned, which is a continuation of application Ser. No. 061,859, filed on Feb. 20, 1987, now abandoned.

The present invention relates to a novel photopolymerizable mixture which has improved sensitivity and contains one or more ethylenically unsaturated photopolymerizable compounds and a photoinitiator system. The present invention furthermore relates to a photosensitive recording element, as used, in particular, for optical information fixing and in reproduction technology, having a photosensitive layer based on this novel photopolymerizable mixture, and to a process for the production of a lithographic printing plate using such a photosensitive recording element.

Photopolymerizable mixtures are widely used, for example for the production of photocurable coatings, finishes, printing inks, protective layers, resist layers, photopolymer printing plates, resist films and the like. An essential requirement which these photopolymerizable mixtures have to meet is that they possess very high photosensitivity, i.e. the photopolymerization or photocuring induced during exposure to actinic light takes place very rapidly, regardless of other effects. This requirement applies in particular to the use of the photopolymerizable mixtures for optical information fixing and in reproduction technology, since in these cases the duration of photopolymerization has a decisive effect on the total processing time.

The photopolymerization initiator is one of the factors which plays a decisive role in determining the photopolymerization properties of the photopolymerizable mixtures. A large number of compounds have already been suggested as photoinitiators capable of initiating polymerization of the ethylenically unsaturated compounds in the photopolymerizable mixtures during exposure to actinic light. These include, for example, benzoin ethers, benzil ketals, benzoylacylphosphine oxide compounds, polynuclear quinones, such as anthraquinone and its derivatives, benzophenone and its derivatives, thioxanthones, s-triazine derivatives containing one or more halomethyl groups, hexa-arylbisimidazoles and others. A list of a large number of photopolymerizable systems with a very wide variety of photoinitiators is given in, for example, the article "Photopolymersysteme und ihre Anwendungen by H.-J. Timpe and H. Baumann, Chemische Technik 36 (1984), 1-7. To improve the photosensitivity of the photopolymerizable mixtures, the use of combinations of photoinitiators or of a photoinitiator and a sensitizer has also been proposed. A well known and very widely used photoinitiator system of this type is the combination of benzophenone and Michler's ketone (cf. inter alia DE-A-1 522 359). In general, amino-containing compounds are used as sensitizers for photoinitiators (cf. for example EP-A-138 187 and GB-A-083 832). Furthermore, mixtures of s-triazines containing one or more halomethyl groups with certain dialkylamino-containing aromatic carbonyl compounds or N-heteroaromatic carbonyl compounds have been described as photoinitiator combinations, for example in DE-A-2 934 758, U.S. Pat. No. 4,239,850 and JP-A-55050001. Nevertheless, there is still a need to increase the photosensitivity of photopolymerizable mixtures and in particular to reduce the sensitivity of these mixtures to the inhibiting effect of oxygen.

DE-A-3 037 521 describes a photopolymerizable material which contains an ethylenically unsaturated, photopolymerizable compound, a polymeric binder, a photopolymerization initiator and an amino-containing s-triazine compound. The photopolymerization initiators stated include anthraquinone and its derivatives, benzophenone and benzophenone derivatives, such as Michler's ketone, and combinations of these compounds. The amino-containing s-triazine compound is used here for improving the adhesion of the photopolymerizable material to a substrate.

To suppress the inhibition by oxygen during the photopolymerization, it has also been proposed that oxygen acceptors be mixed with the photopolymerizable mixtures. This frequently has an advantageous effect on the photopolymerization. For example, 1,3-diphenylisobenzofuran is an efficient oxygen acceptor for certain photopolymerizable mixtures (cf. for example Photographic Sci. Eng. 23 (1979), 137-140).

The photosensitivity of the known photopolymerizable mixtures is increasingly being regarded as too low, in view of the higher requirements and recent processing techniques. It is precisely in the processing of photosensitive, photopolymerizable recording elements in the reproduction industry that the exposure times are frequently the rate-determining parameter. Furthermore, there is to date no known photopolymerizable mixture which satisfies the conditions for camera exposure, as is of great interest precisely in the production of lithographic printing plates. Furthermore, because of digital information processing, it is desirable to have photosensitive recording elements which have higher rates of photopolymerization and are suitable, for example, for laser exposure. Although the inhibition of photopolymerization in the photopolymerizable mixtures by oxygen can be reduced to a certain extent by adding oxygen acceptors, in practice the photopolymerizable layer of photosensitive recording elements is still provided with a top layer which acts as an oxygen barrier. However, in the case of photosensitive recording elements having thin photopolymerizable layers, as are used, inter alia, for the production of resist layers and lithographic printing plates, where the said top layer is generally thicker than the photopolymerizable layer of the photosensitive recording elements, such top layers reduce the resolution.

It is an object of the present invention to provide novel photopolymerizable mixtures having very high photosensitivity. It is a further object of the present invention to provide novel photopolymerizable mixtures which have improved photosensitivity and in which inhibition of the photopolymerization by oxygen is substantially reduced. The novel photopolymerizable mixtures should be particularly suitable for the production of high-resolution photosensitive recording elements having thin photopolymerizable layers, as are used, for example, for the production of resist films and lithographic printing plates, which permit exact image and tonal value reproduction of even fine and very fine image elements and short exposure times.

We have found, surprisingly, that this object is achieved by photopolymerizable mixtures which, in addition to one or more ethylenically unsaturated, photopolymerizable compounds and, if required, further additives and/or assistants, contain, as a photopolymerization initiator, a mixture of one or more compounds of the general formula (I) below, in particular benzophenone, benzophenone derivatives, anthraquinone and anthraquinone derivatives and xanthone and thioxanthone compounds, and one or more s-triazine compounds having one or more halogen-substituted methyl groups.

The present invention accordingly relates to photopolymerizable mixtures containing one or more ethylenically unsaturated, photopolymerizable or photocrosslinkable compounds and a photopolymerization initiator, wherein the photopolymerization initiator comprises a combination of (a) one or more compounds of the general formula (I)

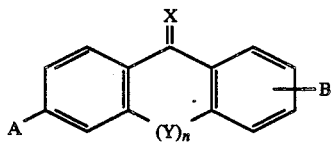

where A is hydrogen, unsubstituted or substituted alkyl, $-NR^1R^2$ (where $R^1$ and $R^2$ are identical or different and independently of one another are each hydrogen or an unsubstituted or substituted aliphatic, aromatic or mixed aliphatic-aromatic radical) or $-OR^3$ (where $R^3$ is hydrogen or an unsubstituted or substituted aliphatic, aromatic or mixed aliphatic-aromatic radical), B is a radical of the type stated under A (where A and B may be identical or different), halogen or the $-C\equiv N$ group, X is oxygen, sulfur or a $=NR^4$ group (where $R^4$ is hydrogen or an aliphatic, aromatic or mixed aliphatic-aromatic radical), Y is a direct bond or a $-CH_2-$, $-CH_2-CH_2-$, $-O-$, $-S-$, $-C(O)-$ or $-NR^5$ group (where $R^5$ is hydrogen or an aliphatic or aromatic radical) and n is 0 or 1, and (b) one or more compounds of the general formula (II)

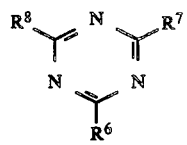

where $R^6$, $R^7$ and $R^8$ are identical or different and are each unsubstituted or substituted alkyl, unsubstituted or substituted aryl or unsubstituted or substituted aralkyl, and one or more of the radicals $R^6$, $R^7$ and $R^8$ are mono-, di- or trihalogen-substituted methyl and one of the radicals $R^6$, $R^7$ or $R^8$ may furthermore be unsubstituted or substituted alkenyl or an $-NR_2$, $-OR-$ or $-SR-$ group, where R in each case is hydrogen, alkyl or aryl.

Preferred unsubstituted or substituted alkenyl groups $R^8$ are styryl groups of the general formula

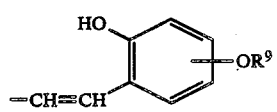

where $R^9$ is hydrogen, alkyl, for example alkyl of 1 to 4, preferably 1 or 2, carbon atoms, or aryl, e.g. phenyl.

The present invention furthermore relates to a photosensitive recording element, in particular for the production of printing plates or resist images, having a photosensitive recording layer applied on a dimensionally stable base, wherein the photosensitive recording layer consists of a novel photopolymerizable mixture of the type stated above. The present invention furthermore relates to a process for the production of printing plates or resist images, in particular lithographic printing plates, using a novel photosensitive recording element as described in detail below. Preferred and specific embodiments of the invention are also described in detail below.

The novel photopolymerizable mixtures according to the invention and the photosensitive recording elements produced using them are distinguished by their high photosensitivity. Although the compounds of the general formula (I) and of the general formula (II) are, individually, conventional photopolymerization initiators for photopolymerizable mixtures, we have found, surprisingly, that the photosensitivity of the photopolymerizable mixtures is increased synergistically by using the novel combination of these compounds as a photoinitiator. At the same time, the inhibiting effect of oxygen is substantially reduced compared with the known photopolymerizable mixtures, and furthermore the photosensitive recording elements based on the novel photopolymerizable mixtures, which can be used, even without special oxygen barrier layers, for the production of printing plates or resist images, exhibit very good, improved resolving power.

Suitable components (a) of the photoinitiator combination to be used according to the invention are all compounds of the general formula (I) above which are known, effective photoinitiators. If A and/or B in the general formula (I) is an $-NR^1R^2$ group, $R^1$ and $R^2$ independently of one another are each preferably hydrogen, alkyl of, in particular, 1 to 4 carbon atoms, hydroxyalkyl of, in particular, 2 to 3 carbon atoms or phenyl. The radicals $R^1$ and $R^2$ may furthermore be bonded to one another to form a 5-membered or 6-membered heterocyclic ring. Where A and/or B in the general formula (I) is a $-OR^3$ group, $R^3$ is preferably hydrogen, alkyl of, in particular, 1 to 8 carbon atoms or phenyl. A and/or B in the general formula (I) may furthermore be unsubstituted or substituted by alkyl of, in particular, 1 to 8 carbon atoms. Examples of substituents A and B in the said formula include hydrogen, dialkylamino, in particular dimethylamino or diethylamino, N-alkyl-N-hydroxyalkylamino, including N-ethyl-N-hydroxyethylamino, hydroxyl, alkoxy, e.g. methoxy or ethoxy, alkyl of 1 to 4 carbon atoms, such as methyl, ethyl, isobutyl or tert-butyl, and haloalkyl, such as chloromethyl or dichloromethyl. B may furthermore be halogen, in particular chlorine or bromine, or nitrile. In the general formula (I), X is preferably oxygen; where X is an $NR^4$ group, it is preferably $=NH$. In the general formula (I), n is 1, i.e. if a group Y connecting the two phenyl rings is present, it is preferably oxygen, sulfur or carbonyl. If, in the general formula (I), n is 0, i.e. no group Y connecting the two phenyl rings is present, the two carbon atoms of the phenyl rings to which the bridging group Y is otherwise bonded are each saturated by a hydrogen atom.

The compounds of the general formula (I) include benzophenone, fluorenone, anthraquinone, xanthone, thioxanthone, acridone and derivatives of these compounds, as described in, for example, DE-A-20 03 122, DE-A-21 22 036, DE-A-28 11 755, EP-A-33 721 and U.S. Pat. No. 3,759,087. Particularly preferred compounds among these are benzophenone and benzophenone derivatives, anthraquinone and anthraquinone derivatives and the xanthone and thioxanthone compounds which are effective photoinitiators. Examples of the compounds of the general formula (I) which are suitable as component (a) of the novel combination of photopolymerization initiators are benzophenone, substituted benzophenones, such as dimethylbenzophenone, diethylbenzophenone, dipropylbenzophenone, amino-containing benzophenones, 4,4'-bisdialkylaminobenzophenones, such as 4,4'-bisdimethylaminobenzophenone (Michler's ketone) and 4,4'-bisdiethylaminobenzophenone, 4,4'-bis-(N-β-hydroxyethyl-N-ethylamino)-benzophenone and similar benzophenone derivatives, as described in, inter alia, EP-A-342, 4,4'-bismorpholinobenzophenone, iminobenzophenones, e.g. auramine O benzosuberone, anthraquinone, 2-methylanthraquinone, 2-ethylanthraquinone, tert-butylanthraquinone, xanthone, thioxanthone, 2-methylthioxanthone, 2-chlorothioxanthone, 2-isopropylthioxanthone and 2-tert-butylthioxanthone, as well as mixtures of 2-methyl- and 4-methylthioxanthone or of 2-isopropyl- and 4-isopropylthioxanthone. Particularly preferred compounds of the general formula (I) are benzophenone and its derivatives, in particular the benzophenones which are bis-substituted by amino groups in the 4,4'-position, such as Michler's ketone, and the thioxanthone derivatives, in particular chlorothioxanthone.

The photoinitiator mixture according to the invention can contain one or more of the abovementioned compounds of the general formula (I) as component (a).

According to the invention, the photoinitiator in the photopolymerizable mixtures contains, in combination with the component (a) described above, one or more s-triazine compounds of the above general formula (II) as component (b). Particularly suitable components (b) are the s-triazine compounds which are known per se as photoinitiators and conventionally used as such. In the general formula (II), $R^6$ is, in particular, a mono-, di- or trihalogen-substituted methyl group, in particular monochloromethyl, dichloromethyl, trichloromethyl, monobromomethyl, dibromomethyl or tribromomethyl. Particularly advantageous s-triazines of the general formula (II) are those in which $R^6$ is trichloromethyl or tribromomethyl. In the general formula (II), $R^7$ is preferably a mono-, di- or trihalogen-substituted methyl group, in particular monochloromethyl, monobromomethyl, dichloromethyl, dibromomethyl and, very particularly preferably, trichloromethyl or tribromomethyl, or a $-NR_2-$, $-OR-$ or $-SR-$ group, where R in each case is hydrogen, alkyl, preferably of 1 to 6 carbon atoms, e.g. methyl, ethyl, butyl or hexyl, or aryl, e.g. phenyl. Particularly preferred s-triazine compounds of the general formula (II) contain a trichloromethyl or tribromomethyl group as the radical $R^7$. In the general formula (II), $R^8$ is preferably unsubstituted or substituted alkyl, unsubstituted or substituted aryl or unsubstituted or substituted alkenyl. Suitable alkyl groups $R^8$ are in particular those of about 1 to about 10 carbon atoms, e.g. methyl, ethyl, propyl or butyl, and halogen-substituted alkyl, preferably chlorine-substituted or bromine-substituted alkyl of 1 to about 10 carbon atoms, such as trichloromethyl or tribromomethyl. Suitable aryl groups $R^8$ are those containing 1, 2 or 3 (fused) rings, e.g. phenyl, naphthyl or anthryl, and these aryl groups may be substituted by, for example, alkyl (preferably of 1 to 4 carbon atoms), alkoxy (preferably of 1 to 4 carbon atoms), halogen (preferably chlorine or bromine), nitro or cyano. Preferred alkenyl groups $R^8$ are those which contain two or more conjugated ethylenic double bonds and in which the said double bonds are furthermore conjugated with an unsubstituted or substituted aromatic or heteroaromatic ring system. In the general formula (II), $R^8$ is preferably unsubstituted or substituted aryl of the stated type and in particular 2'-hydroxy-4'-methoxystyryl.

Compounds of the general formula (II), as may be present according to the invention in the photoinitiator combination as component (b), are described in, for example, U.S. Pat. Nos. 4,239,850, 3,954,475 and DE-A-2 934 758. Examples of the s-triazine compounds of the general formula (II) which are to be used according to the invention are 2,4,6-tris-(trichloromethyl)-s-triazine, 2-methyl-4,6-bis-(trichloromethyl)-s-triazine, 2,4-diethyl-6-dichloromethyl-s-triazine, 2-phenyl-4,6-bis-(trichloromethyl)-s-triazine, 2-(p-methoxyphenyl)-4,6-bis-(trichloromethyl)-s-triazine, 2-(p-tolyl)-4,6-bis-(trichloromethyl)-s-triazine, 2-(o,p-dichlorophenyl)-4,6-bis-(trichloromethyl)-s-triazine, 2-(p-methoxystyryl)-4,6-bis-(trichloromethyl)-s-triazine, 2-methyl-4,6-bis-(tribromomethyl)-s-triazine, 2,4,6-tris-(dibromomethyl)-s-triazine, 2-(naphth-1'-yl)-4,6-bis-(trichloromethyl)-s-triazine, 2-(4'-methoxynaphth-1'-yl)-4,6-bis-(trichloromethyl)-s-triazine and the like. Preferred compounds among these are the 4,6-bis-(trichloromethyl)-s-triazines which carry an unsubstituted or substituted aryl radical in the 2-position, including 2-(p-methoxyphenyl)-4,6-bis-(trichloromethyl)-s-triazine and 2-(4'-methoxynaphth-1'-yl)-4,6-bis-(trichloromethyl)-s-triazine, as well as 2-(2'-hydroxy-3'-methoxystyryl)-4,6-bis-(trichloromethyl)-s-triazine, 2-(2'-hydroxy-5'-methoxystyryl)-4,6-bis-(trichloromethyl)-s-triazine, 2-(2'-hydroxy-6'-methoxystyryl)-4,6-bis-(trichloromethyl)-s-triazine, 2-(2'-hydroxy-4'-ethoxystyryl)-4,6-bis-(trichloromethyl)-s-triazine, 2-(2'-hydroxy-4'-phenoxystyryl)-4,6-bis-(trichloromethyl)-s-triazine and in particular 2-(2'-hydroxy-4'-methoxystyryl)-4,6-bis-(trichloromethyl)-s-triazine. In the novel recording layers or lithographic printing plates, the lastmentioned compound has a particularly advantageous effect on their shelf life.

The components (a) and (b) of the photoinitiator are usually present in the novel photopolymerizable mixtures in a weight ratio such that the component (b) accounts for the predominant part of the photoinitiator mixture ((a)+(b)). In general, the weight ratio of the compounds of the general formula (I) (component (a)) to the compounds of the general formula (II) (component (b)) in the photopolymerizable mixtures is from 10:90 to 40:60, in particular from 15:85 to 30:70. The compounds of the general formula (I) (component a) are generally present in the photopolymerizable mixture in an amount of from 0.1 to 5, preferably from 0.8 to 4, % by weight, based on the said mixture. The compounds of the general formula (II), i.e. component (b) of the photoinitiator, are usually present in the novel photopolymerizable mixtures in an amount of from 0.4 to 10, preferably from 1.2 to 8, % by weight, based on the photopolymerizable mixture, the ratio of component (a) to component (b) being in the abovementioned range and the sum of components (a) and (b), i.e. the total amount of photoinitiator, in the photopolymerizable mixture usually being from 0.5 to 15, preferably from 2 to 12, % by weight, based on the total photopolymerizable mixture.

In principle, any ethylenically unsaturated compounds capable of undergoing a photoinitiated polymerization or crosslinking reaction are suitable ethylenically unsaturated, photopolymerizable compounds for the novel photopolymerizable mixture. These include both monomers and ethylenically unsaturated, photopolymerizable oligomers and corresponding unsaturated polymers. The monomers generally have a molecular weight of less than 1,000. The mean molecular weight (number average) of the said oligomers is preferably from about 1,000 to about 10,000, in particular from about 1,500 to 6,000. Preferred ethylenically unsaturated, photopolymerizable compounds are those whose photopolymerizable double bonds are activated by, for example, aryl, carbonyl, amide, ester, carboxyl or nitrile groups, halogen atoms or C—C double or triple bonds. The ethylenically unsaturated, photopolymerizable compounds may be monofunctional or polyfunctional, i.e. they may contain one or more photopolymerizable, ethylenic double bonds. Particularly when they are used for the production of photosensitive recording elements, the photopolymerizable mixtures usually contain bifunctional or polyfunctional ethylenically unsaturated photopolymerizable compounds alone or as a mixture with a minor amount of monofunctional ethylenically unsaturated photopolymerizable compounds. The ethylenically unsaturated photopolymerizable compounds which are present alone or as a mixture with one another are adequately described in the relevant technical literature. The choice of the type and amount of these compounds depends in particular on the intended use of the photopolymerizable mixtures and is familiar to the skilled worker.

The ethylenically unsaturated, photopolymerizable monomers include, for example, the vinyl compounds, such as vinyl ethers, vinyl esters, styrene, vinyl chloride, vinylidene chloride, vinyl ketones, vinyl sulfones, N-vinylpyrrolidone, N-vinylcaprolactam and N-vinylcarbazole, as well as allyl esters, such as diallyl phthalate. The acryloyl-containing and/or methacryloyl-containing monomers are particularly advantageous. These include, in particular, the esters of acrylic acid and methacrylic acid, such as the di- and tri(meth)acrylates of dihydric or polyhydric alcohols, for example of ethylene glycol, diethylene glycol, triethylene glycol or polyethylene glycols having a molecular weight of up to about 500, propane-1,2-diol, propane-1,3-diol, propylene glycols having a molecular weight of up to about 500, butane-1,4-diol, 1,1,1-trimethylolpropane, 2,2-dimethylpropanediol, glycerol or pentaerythritol; pentaerythritol tetra(meth)acrylate; the monoacrylates and monomethacrylates of the stated diols or polyols, e.g. ethylene glycol (meth)acrylate, di-, tri- and tetraethylene glycol mono(meth)acrylate, propanediol mono(-meth)acrylate and butanediol mono(meth)acrylate; the (meth)acrylates of monoalkanols, in particular of those of 1 to 20 carbon atoms; (meth)acrylamide, N-methylol(meth)acrylamide, methylenebis(meth)acrylamide, the bisethers of ethylene glycol and of N-methylol(meth)acrylamide; urethane acrylates and methacrylates containing two or more acryloyl or methacryloyl groups, as can be prepared, for example, by reacting organic di- or polyisocyanates with monohydroxy(meth)acrylates, in particular hydroxyalkyl(meth)acrylates; (meth)acrylate monomers containing two or more acryloyl and/or methacryloyl groups, as are obtainable by reacting acrylic acid and/or methacrylic acid with di- or polyglycidyl compounds, in particular di- or polyglycidyl ethers, for example the reaction product of 2 moles of acrylic acid and/or methacrylic acid with 1 mole of bisphenol A bisglycidyl ether.

The particularly preferred photopolymerizable ethylenically unsaturated monomers include trimethylolpropane triacrylate, trimethylolpropane trimethacrylate, pentaerythritol tri- and tetraacrylate, pentaerythritol tri- and tetramethacrylate and monomeric urethane (meth)acrylates and monomeric epoxy(meth)acrylates of the abovementioned type.

It has proven particularly advantageous, particularly for the production of photosensitive recording elements having thin photopolymerizable recording layers, as are used, for example, for the production of resist images or lithographic printing plates, if the photopolymerizable mixtures contain, as ethylenically unsaturated, photopolymerizable compounds, oligomers, in particular film-forming oligomers, possessing two or, preferably, more than two acryloyl and/or methacryloyl groups. These may be, for example, polyester(meth)acrylates, oligomeric urethane resins containing acryloyl and/or methacryloyl groups or oligomeric resins based on di- or polyepoxides and containing acryloyl and/or methacryloyl groups, as are known per se and described in the literature. Of particular interest, especially where the photopolymerizable mixtures are used in photosensitive recording elements, are those oligomers of the type under discussion which contain not only the acryloyl and/or methacryloyl groups but also free carboxyl groups in the molecule, so that the oligomers are soluble or dispersible in aqueous alkaline media. The amount of free carboxyl groups in these photopolymerizable oligomers is advantageously sufficiently high for the oligomers to have an acid number of from 50 to 150 mg of KOH/g. Ethylenically unsaturated, photopolymerizable oligomers, as are suitable for use in the novel photopolymerizable mixtures, are described in, for example, DE-A-24 42 527, DE-C-25 57 408 and DE-A-29 17 483. Oligomeric polyester (meth)acrylates can be prepared, for example, by reacting hydroxyl-containing polyesters with acrylic and/or methacrylic acid or by subjecting (meth)acryloyl-containing diols to a chain-extending reaction with polycarboxylic acids, in particular tri-or tetracarboxylic acids or, preferably, their cyclic anhydrides. The (meth)acryloyl-containing diols may be, for example, reaction products of dicarboxylic acids with glycidyl (meth)acrylate or the reaction products of acrylic and/or methacrylic acid with di- or polyepoxides.

Oligomeric urethane resins containing free carboxyl groups and two or more acryloyl and/or methacryloyl groups have proven very advantageous as ethylenically unsaturated, photopolymerizable compounds for the novel photopolymerizable mixtures. Such oligomeric urethane resins, which preferably contain more than two (meth)acryloyl groups per molecule, can be prepared, for example, by reacting diols and/or polyols containing acryloyl and/or methacryloyl groups with di- and/or polyisocyanates, in the presence or absence of other diols, with chain extension and formation of an oligomeric urethane resin, in such a way that only some of the hydroxyl groups of the diols and/or polyols are converted to urethane groups, with the result that some or all of the remaining hydroxyl groups of the urethane resins thus obtained are esterified with polybasic carboxylic acids or their derivatives, in particular cyclic dicarboxylic anhydrides, with the formation of acidic partial esters of the polyfunctional carboxylic acids. The (meth)acryloyl-containing diols or polyols for the reaction with the di- and/or polyisocyanates can be obtained, for example, by reacting di- or polyepoxides with acrylic and/or methacrylic acid in an amount such that, preferably, about 50–100% of the glycidyl groups are converted to β-hydroxy(meth)acrylate groups. Examples of particularly suitable di- and polyepoxide compounds here are the di- and polyglycidyl ethers of dihydric or polyhydric alcohols and in particular dihydric or polyhydric phenols, in particular the diglycidyl ethers of epichlorohydrin and bisphenol A. The di-and polyepoxides can also be subjected to chain-extension by reaction with aliphatic or aromatic dicarboxylic acids, e.g. adipic acid or phthalic acid, before or during the reaction with the acrylic and/or methacrylic acid. The di- and polyisocyanates which are suitable for further reaction of the resulting polyhydroxy(meth)acrylates include, in particular, aliphatic, cycloaliphatic and aromatic diisocyanates, e.g. hexamethylene diisocyanate, cyclohexane diisocyanate, toluylene diisocyanate, isophorone diisocyanate and others. The reaction with the isocyanates takes place with the chain extension and the formation of the urethane oligomer which still contains residual hydroxyl groups. Thereafter, the free hydroxyl groups still remaining in the oligomer are reacted with polybasic carboxylic acids or their derivatives, in particular aliphatic or aromatic cyclic dicarboxylic anhydrides, e.g. phthalic anhydride, with formation of the corresponding acidic carboxylic half esters. To prepare these oligomeric urethane resins containing carboxyl groups and acryloyl and/or methacryloyl groups, the di-or polyepoxides are reacted with the (meth)acrylic acid preferably in amounts such that the ratio of the number of equivalents of glycidyl radicals to that of carboxyl radicals is from 1:0.5 to 1:1. Urethane groups are then introduced into the di- or polyhydroxy(meth)acrylates resulting from this reaction by reacting the said (meth) acrylates with the di- and/or polyisocyanates, preferably in amounts such that the ratio of the number of equivalents of OH to that of NCO is from 1:0.2 to 1:0.8. Some or all of the remaining hydroxyl groups of the resulting urethane oligomers are then reacted with the polyfunctional carboxylic acids or their derivatives, with formation of the acidic partial esters of these carboxylic acids, to the extent required to establish the desired acid number of the oligomer.

Other advantageous photopolymerizable, ethylenically unsaturated oligomers are those obtained when, for example, some of the glycidyl groups of an oligomeric resin carrying a plurality of glycidyl groups are reacted with acrylic acid and/or methacrylic acid, and the remainder of the glycidyl groups are then reacted with polybasic carboxylic acids, in particular dicarboxylic acids, e.g. phthalic acid, terephthalic acid or adipic acid, with formation of acidic partial esters of these polybasic carboxylic acids. Oligomers which are just as advantageous are obtained when the acryloyl and/or methacryloyl groups are introduced into an oligomeric resin carrying a plurality of free carboxyl groups, by reacting some of the free carboxyl groups of this resin with epoxide-containing acrylates and/or methacrylates, e.g. glycidyl (meth)acrylate.

Other ethylenically unsaturated, photopolymerizable oligomers whose use in the novel photopolymerizable mixtures and photosensitive recording elements produced from these mixtures has led to particularly advantageous results can be prepared, for example, by reacting the hydroxyl groups of a diol or polyol compound containing acryloyl and/or methacryloyl groups with polybasic carboxylic acids or, in particular, cyclic carboxylic anhydrides in such a way that the acidic partial esters of the said carboxylic acids are formed, and then reacting some of the free carboxyl groups of the reaction product thus obtained with di- and/or polyepoxides, with chain extension and, where relevant, branching. The said diol or polyol compounds which serve as starting materials for the preparation of such oligomers are advantageously prepared by reacting di- or polyepoxide compounds, e.g. di- or polyglycidyl ethers or di- or polyglycidyl esters, with acrylic acid and/or methacrylic acid in amounts such that the ratio of the number of equivalents of glycidyl groups to that of COOH groups is about 1:1. The di- or polyepoxide compounds may also, for example, be subjected to a preliminary chain-extending reaction with dicarboxylic acids, before or during the reaction with the (meth)acrylic acid. Typical examples of oligomers of the last-mentioned type are the products obtainable by reacting bisphenol A bisglycidyl ether with acrylic and/or methacrylic acid or with a mixture of about 30–70 mol % of a dicarboxylic acid, e.g. adipic acid, and about 30–70 mol % of acrylic and/or methacrylic acid in amounts such that the ratio of the number of equivalents of glycidyl groups to the total number of equivalents of COOH is about 1:1, reacting the hydroxyl groups of the reaction product thus obtained with a cyclic dicarboxylic anhydride, e.g. phthalate anhydride, if necessary as a mixture with a minor amount of an anhydride of another polybasic carboxylic acid, e.g. trimellitic anhydride, in amounts such that the ratio of the number of equivalents of OH groups to that of anhydride groups is about 1:1, with formation of the acidic partial esters of the polybasic carboxylic acids, and finally reacting some of the free carboxyl groups of the reaction product thus obtained with the di- and/or polyglycidyl ether, for example bisphenol A bisglycidyl ether or pentaerythritol triglycidyl ether, in amounts such that the ratio of the number of equivalents of COOH groups to that of glycidyl groups is greater than 1:1, preferably from 1.15:1 to 5:1.

According to the invention, other suitable ethylenically unsaturated, photopolymerizable or photocrosslinkable compounds are, as stated above, unsaturated polymeric compounds. These include, for example, unsaturated polyesters, as can be obtained from $\alpha,\beta$-unsaturated dicarboxylic acids, if necessary as a mixture with saturated aliphatic or aromatic dicarboxylic acids, by reaction with alkanediols or oxyalkylated bisphenol A; unsaturated aminoplast resins, as can be obtained, for example, by reacting unetherified or etherified aminoplasts, such as melamine/formaldehyde or urea/formaldehyde condensates, with hydroxyalkyl (meth)acrylates; vinyl-containing polyurethanes, for example those of the type described in U.S. Pat. No. 3,658,531, DE-A-23 00 371 or EP-A-72 918, and modified polyvinyl alcohols possessing photopolymerizable, olefinically unsaturated side groups, for example vinyl-containing polyvinyl alcohols or polyvinyl alcohols containing acryloyl and/or methacryloyl groups, as described in, inter alia, DE-A-15 22 359, GB-A-834 337, EP-A-129 901 or EP-A-129 902.

Where the novel photopolymerizable mixtures are used for the production of photosensitive recording elements which have a high photosensitivity and can be developed in aqueous media, vinyl polymers containing free carboxyl groups and acryloyl and/or methacryloyl groups have also proven particularly advantageous as ethylenically unsaturated, photopolymerizable compounds. Such photopolymerizable or photocrosslinkable polymers are described in, inter alia, U.S. Pat. No. 3,796,578. These include the copolymers of (meth)acrylic acid and one or more comonomers from the group consisting of the alkyl (meth)acrylates and monovinylaromatic monomers and, if desired, further comonomers, e.g. (meth)acrylonitrile, vinyl esters or vinyl ethers, the said copolymers being soluble or dispersible in aqueous alkaline developers, and some of the free carboxyl groups of the polymerized (meth)acrylic acid comonomer units having been reacted with suitable (meth)acryloyl-containing compounds to introduce the (meth)acryloyl groups into the copolymer. Particularly suitable (meth)acryloyl-containing compounds for introducing the methacryloyl-containing radicals into the copolymer are the glycidyl (meth)acrylates. These advantageous ethylenically unsaturated, photopolymerizable or photocrosslinkable polymers usually have a weight average molecular weight greater than about 10,000, preferably from about 15,000 to about 500,000, in particular from about 20,000 to 250,000; the acid number of these copolymers is in general from 40 to 80, in particular from about 50 to 70, mg of KOH/g. Particularly suitable alkyl (meth)acrylates for the preparation of these copolymers are alkyl acrylates and alkyl methacrylates where alkyl is of 1 to 8 carbon atoms. Examples of the monovinylaromatic comonomers are, in particular, styrene, styrenes which are substituted in the nucleus and α-methylstyrene. Examples of the base copolymers, some of whose free carboxyl groups are reacted with glycidyl acrylate and/or glycidyl methacrylate in order to introduce the (meth)acryloyl groups, are the (meth)acrylic acid/alkyl (meth)acrylate copolymers, the (meth)acrylic acid/styrene copolymers and the (meth)acrylic acid/alkyl (meth)acrylate/styrene copolymers, which contain about 10–40 mol % of acrylic acid and/or methacrylic acid as copolymerized units. Typical examples of these base copolymers are copolymers consisting of from 10 to 30 mol % of (meth)acrylic acid and from 70 to 90 mol % of methyl (meth)acrylate or of from 10 to 25 mol % of (meth)acrylic acid, from 25 to 60 mol % of methyl (meth)acrylate and from 30 to 50 mol % of styrene. To prepare the ethylenically unsaturated, photopolymerizable or photocrosslinkable polymers used according to the invention, these (meth)acrylic acid base polymers are reacted with an amount of glycidyl acrylate and/or glycidyl methacrylate which corresponds to about 0.1–0.7, in particular about 0.3–0.6, equivalent of free carboxyl groups in the base copolymer.

In addition to the photoinitiators and the ethylenically unsaturated, photopolymerizable compounds, the novel photopolymerizable mixtures can contain further additives and/or assistants, in particular for improving or modifying the performance characteristics and/or processing properties. Such additives and/or assistants include thermal polymerization inhibitors, dyes and/or pigments, fillers, film-forming nonphotopolymerizable and nonphotocrosslinkable polymers, plasticizers, leveling agents, dulling agents, lubricants, reinforcing agents, UV stabilizers, photochromic systems, sensitizers and the like. The photopolymerizable mixtures contain these additives, where they are present, in effective amounts conventionally used for these substances and familiar to the skilled worker. If, in addition to the ethylenically unsaturated, photopolymerizable compounds, the photopolymerizable mixtures contain film-forming, nonphotopolymerizable and nonphotocrosslinkable polymeric binders, e.g. nylons, vinyl alcohol polymers, partially hydrolyzed polyvinyl acetates, polyurethanes, (meth)acrylate polymers or copolymers, styrene polymers or copolymers and the like, and are intended to be used for the production of photosensitive recording elements, these film-forming polymeric binders are chosen so that they are compatible with the ethylenically unsaturated, photopolymerizable compounds. For photosensitive recording elements, in particular lithographic printing plates, photopolymerizable mixtures which can be developed with aqueous, in particular aqueous alkaline, solutions are preferably chosen. If the photopolymerizable mixtures contain film-forming polymeric binders, these binders are therefore preferably chosen in these cases so that they are soluble or dispersible in the aqueous, in particular aqueous alkaline, developers. These binders include the styrene/maleic anhydride copolymers, styrene/maleic (half) ester copolymers, styrene/maleic anhydride/(meth)acrylic acid copolymers, (meth)acrylate/(meth)acrylic acid copolymers, styrene/(meth)acrylate/(meth)acrylic acid copolymers, copolymers of the abovementioned type which moreover contain up to about 2% by weight, based on the copolymer, of (meth)acrylic anhydride as polymerized comonomer, as described in, for example, EP-A-152 889, dicyclopentadiene/maleic anhydride copolymers, as described in, for example, EP-A-140 353, copolymers of from 10 to 50% by weight of one or more N-vinyllactams, from 5 to 30% by weight of acrylic acid and/or methacrylic acid and from 30 to 80% by weight of styrene and/or alkyl (meth)acrylates, copolymers of from 10 to 50% by weight of one or more hydroxyalkyl (meth)acrylates, from 5 to 30% by weight of acrylic acid and/or methacrylic acid and from 30 to 80% by weight of one or more alkyl (meth)acrylates and the like, the said copolymers being known per se and conventionally used for these purposes.

Examples of suitable thermal polymerization inhibitors which may be present in the photopolymerizable mixtures are hydroquinone, hydroquinone derivatives, 2,6-di-tert-butyl-p-cresol, nltrophenols, N-nitrosodiphenylamine and the salts of N-nitrosocyclohexylhydroxylamine. Examples of dyes and/or pigments, which may act as contrasting agents as well as compacting the layer, include Brilliant Green Dye (C.I. 42,040), Victoria Pure Blue FGA, Victoria Pure Blue BO (C.I. 42,595), Victoria Blue B (C.I. 44,045), Rhodamine 6G (C.I. 45,160), etc. Photochromic systems which change their color reversibly or irreversibly during exposure to actinic light without having an adverse effect on the polymerization process are, for example, leuco dyes together with suitable activators or photochemical oxidizing agents. When used in photosensitive recording elements, the photopolymerizable mixtures may also contain sensitometric regulators, e.g. 9-nitroanthracine, 10,10'-bisanthrone or phenacinium, phenoxacinium, acridinium or phenothiacinium dyes, in particular in combination with mild reducing agents, 1,3-dinitrobenzenes and the like.

The type and amount of these additives depend on the intended use of the novel photopolymerizable mixtures, and their selection is familiar to the skilled worker. If the said mixtures contain, for example, film-forming, nonphotopolymerizable or nonphotocrosslinkable polymeric binders, the ethylenically unsaturated, photopolymerizable compounds generally used are photopolymerizable monomers or mixtures consisting of a predominant amount of photopolymerizable monomers and a minor amount of photopolymerizable, ethylenically unsaturated oligomers. If the ethylenically unsaturated photopolymerizable compounds present in the photopolymerizable mixtures are photopolymerizable, in particular film-forming, oligomers or photopolymerizable or photocrosslinkable polymers, the addition of further film-forming, nonphotopolymerizable and nonphotocrosslinkable polymeric binders can often be dispensed with. Surprisingly, photopolymerizable mixtures which have proven particularly advantageous are those which essentially contain, as ethylenically unsaturated, photopolymerizable compounds, only ethylenically unsaturated, photopolymerizable, preferably film-forming oligomers and/or photopolymerizable or photocrosslinkable polymers and only a minor amount of photopolymerizable monomers, if any at all, and which furthermore contain only a minor amount of additional, film-forming, non-photopolymerizable and nonphotocrosslinkable polymeric binders, if any at all. The novel photopolymerizable mixtures usually essentially consist of from about 0.5 to 15% by weight of the photopolymerization initiator comprising the components (a) and (b), from 5 to 99.5% by weight of the ethylenically unsaturated, photopolymerizable compounds, from 0 to 90% by weight of a film-forming, non-photopolymerizable and nonphotocrosslinkable polymeric binder and from 0 to 25% by weight of further additives and/or assistants, such as thermal polymerization inhibitors, dyes and/or pigments, photochromic compounds, sensitometric regulators, plasticizers, fillers, reinforcing agents and the like, the stated percentages by weight being based in each case on the total photopolymerizable mixture.

The novel photopolymerizable mixtures have a very wide variety of uses and are particularly suitable for the production of thin photocurable layers, for example about 0.1–50 μm thick. They can therefore be used in a conventional manner for the production of photocurable coatings, coatings for protective and decorative purposes on any substrates, e.g. metals, wood, plastics, glass, paper or cardboard, and of impregnating materials or photocurable printing inks. Curing and photopolymerization can be carried out using the conventional sources of actinic light, in particular those whose emission maxima are between 300 and 420 nm.

The novel photopolymerizable mixtures are particularly advantageous for the production of photosensitive recording elements having thin, photosensitive, photopolymerizable recording layers, as conventionally used in reproduction technology, not only as a photoresist but in particular for the production of lithographic printing plates.

The novel photosensitive recording elements contain a photosensitive, photopolymerizable recording layer which is applied on a dimensionally stable base and consists of a novel photopolymerizable mixture. The said recording layer of this photosensitive recording element is usually about 0.1–50 μm thick. While thicker recording layers are suitable for photoresist films, for example layers from 5 to 50 μm thick, the thickness of the photopolymerizable recording layer for lithographic printing plates is preferably from 0.5 to 8 μm, in particular from 0.7 to 3.5 μm.

Suitable bases for the photopolymerizable recording layers are the dimensionally stable, rigid or flexible bases conventionally employed for photosensitive recording elements, the type of base depending on the intended use of the photosensitive recording elements. Particularly suitable dimensionally stable bases are plastic films or sheets, for example those consisting of polyethylene terephthalate, as well as metallic bases, e.g. steel, aluminum or copper sheets. In the case of photoresist materials, the photopolymerizable recording layer can also be applied directly to the substrate to be protected and, if required, to be modified permanently, the said substrate then serving as the base for the photopolymerizable recording layer. Suitable substrates for photoresist layers include copper sheets, copper-plated bases, metal-coated or metal oxide-coated ceramic substrates, semiconductor elements, silicon wafers and the like. In the case of photosensitive recording elements which are used for the production of lithographic printing plates, preferably used dimensionally stable bases are aluminum sheets or foils, which are advantageously mechanically or electrochemically roughened on the surface by a conventional method, then preferably anodically oxidized and thereafter if required, also subjected to an after-treatment. One or more intermediate layers may furthermore be arranged between the photosensitive, photopolymerizable recording layer and the dimensionally stable base, the said intermediate layers serving, for example, to improve adhesion. In the novel photosensitive recording elements, such intermediate layers between the dimensionally stable base and the photopolymerizable recording layer are generally dispensed with.

The composition of the photopolymerizable recording layer of the novel photosensitive recording elements can be varied within wide limits. In a conventional embodiment, the said recording layer is formed from a novel photopolymerizable mixture which essentially consists of from 0.5 to 15, preferably from 2 to 12, % by weight of the photopolymerization initiator comprising the components (a) and (b), from 8 to 65% by weight of ethylenically unsaturated, photopolymerizable monomers or of a mixture of a predominant amount of photopolymerizable monomers and a minor amount of ethylenically unsaturated, photopolymerizable oligomers and/or photopolymerizable or photocrosslinkable polymers, from 30 to 90% by weight of a film-forming, nonphotopolymerizable and nonphotocrosslinkable polymeric binder and from 0 to 25% by weight of further additives and/or assistants of the above type.

It has proven particularly advantageous, particularly for the production of lithographic printing plates, to produce the photopolymerizable recording layer of the photosensitive recording elements essentially from a novel, homogeneously photopolymerizable mixture of from 0.5 to 15, preferably from 2 to 12, % by weight of the photoinitiator comprising the components (a) and (b), from 99.5 to 70, in particular from 97.5 to 75, % by weight, of one or more ethylenically unsaturated, photopolymerizable oligomers containing free carboxyl groups and not less than 2, preferably more than 2, acryloyl and/or methacryloyl groups in the molecule and having an acid number of from 50 to 120 mg of KOH/g and a mean molecular weight (number average) of from 1,000 to 10,000, preferably from 1,500 to 6,000, from 0 to 10% by weight of one or more ethylenically unsaturated, photopolymerizable monomers which are compatible with the oligomer and have a molecular weight of less than 1,000, from 0 to 10% by weight of one or more polymers which are compatible with the other components and may or may not possess photopolymerizable or photocrosslinkable groups, and from 0 to 10, preferably from 0.5 to 5, % by weight of further additives and/or assistants, in particular thermal polymerization inhibitors, dyes, pigments, photochromic systems, fillers, reinforcing agents and the like. The percentages by weight as stated above are based in each case on the total photopolymerizable mixture. Particularly suitable ethylenically unsaturated, photopolymerizable oligomers for these preferred photopolymerizable recording layers are the ethylenically unsaturated, photopolymerizable oligomers stated above. Where, in addition to the ethylenically unsaturated, photopolymerizable oligomers, these preferred, photopolymerizable recording layers also contain photopolymerizable monomers and/or polymers, the amount of these compounds is in general not less than 1% by weight in each case, based on the photopolymerizable recording layer. However, we have found that the addition of photopolymerizable monomers and/or polymers to these preferred polymerizable recording layers can be completely dispensed with, in which case the amount of ethylenically unsaturated, photopolymerizable oligomers in the said recording layers is not less than 75, preferably not less than 85, % by weight, based on the total photopolymerizable mixture. The photosensitive recording elements possessing such photopolymerizable recording layers have high photosensitivity, exhibit very little inhibition of photopolymerization by oxygen and can be processed simply and rapidly to give exact image reproduction faithful to the original.

In another very advantageous embodiment, the photopolymerizable recording layer of the novel photosensitive recording elements contains, as ethylenically unsaturated, photopolymerizable compounds, a mixture of one or more photopolymerizable monomers and one or more photopolymerizable or photocrosslinkable vinyl polymers having a mean molecular weight (weight average) of from about 15,000 to 500,000, preferably from about 20,000 to 250,000, in which about 3-30%, preferably 5-25%, of all repeating units carry (meth)acryloyl-containing side groups, and which furthermore contain free carboxyl groups in amounts such that the acid number of the polymer is from 40 to 100, preferably from 50 to 90, mg of KOH/g. In this mixture of the ethylenically unsaturated, photopolymerizable compounds, the weight ratio of the photopolymerizable monomers to the photopolymerizable or photocrosslinkable polymers is usually from about 1:15 to about 1:1, i.e. the said polymers generally constitute the predominant part of this mixture. Photopolymerizable or photocrosslinkable polymers which have proven particularly advantageous for these preferred polymerizable recording layers are, in particular, the abovementioned copolymers of acrylic acid and/or methacrylic acid, mono vinylaromatic monomers and/or alkyl (meth)acrylates and, where relevant, further comonomers, in which some of the free carboxyl groups have been converted to (meth)acryloyl-containing side groups by reaction with glycidyl acrylate and/or glycidyl methacrylate. Preferred photopolymerizable monomers for these mixtures are likewise the abovementioned monomers which contain acryloyl or methacryloyl groups and are compatible with the photopolymerizable or photocrosslinkable polymer of the type under discussion. In this preferred embodiment of the novel photosensitive recording elements, the photopolymerizable recording layer essentially consists of a novel, homogeneously photopolymerizable mixture of from 0.5 to 15, preferably from 2 to 12, % by weight of a photopolymerization initiator comprising the components (a) and (b), from 75 to 99.5, preferably from 85 to 97, % by weight of the abovementioned mixture of photopolymerizable monomers and photopolymerizable or photocrosslinkable polymers as ethylenically unsaturated, photopolymerizable compounds and from 0 to 10, preferably from 0.5 to 5, % by weight of additives and/or assistants, such as thermal polymerization inhibitors, dyes, pigments, photochromic systems, fillers, reinforcing agents and the like, the percentages in each case being based on total photopolymerizable mixture. In this case too, the photosensitive recording elements of the invention possess very good exposure and reproduction properties, and these photosensitive recording elements too exhibit not only very high photosensitivity but also only very little inhibition of photopolymerization by oxygen, so that they can be exposed without special precautions. Moreover, the photopolymerizable recording layers of these photosensitive recording elements are dry, firm and non-tacky, so that they are substantially easier to handle.

Furthermore, the components of the photopolymerizable recording layer of the novel photosensitive recording elements are, quite generally, selected and matched with one another in such a way that the recording elements, after imagewise exposure to actinic light, can be developed in the developers conventionally used for this purpose, in particular aqueous alkaline developers. Although it is also possible in principle for a top layer to be applied to that surface of the photopolymerizable recording layer which faces away from the base, the said top layer preferably being soluble in the same developer as the photopolymerizable recording layer, such a top layer, as otherwise conventionally used in photosensitive record-elements of the type under discussion, can be dispensed with in the novel photosensitive recording elements, owing to the high photosensitivity and insensitivity to oxygen of the novel photopolymerizable mixtures.

The novel photosensitive recording elements can be produced in a conventional manner by preparing a homogeneous mixture of the components forming the photopolymerizable recording layer and applying this mixture in the form of a layer on the dimensionally stable base, which, if required, has been provided with an intermediate layer. To do this, for example, the components of the photopolymerizable recording layer can be dissolved in a suitable solvent or solvent mixture and this solution applied to the base as a layer of the desired thickness, by casting, immersion, spraying or another conventional application technique. The solvent is then removed in a conventional manner, and the photopolymerizable recording layer is dried. Suitable solvents for mixing the components and applying the photopolymerizable recording layer to the base include lower alcohols, ketones or esters, e.g. methanol, acetone, methyl ethyl ketone, ethyl acetate and the like, and mixtures of these. If a top layer has also been provided for the photosensitive recording elements, this layer can then be applied to the photopolymerizable recording layer.

The novel photosensitive recording elements are useful, for example, for the production of resist images, screens, screen printing plates and the like by the methods conventionally used for this purpose, and are particularly suitable for the production of lithographic printing plates. To do this, the photopolymerizable recording layer is exposed imagewise to actinic light, the usual sources of actinic light, for example UV fluorescent tubes, high pressure, medium pressure and low pressure mercury lamps, superactinic fluorescent tubes, pulsed xenon lamps and the known UV lasers, being suitable for this purpose. The wavelength emitted by the light sources is preferably matched up with the self-absorption of the photoinitiator and is in general from 300 to 420 nm. Imagewise exposure to actinic light initiates photopolymerization in the exposed parts of the recording layer, and this photopolymerization leads to cross-linking and hence to a differentiation in the solubilities of the exposed and unexposed parts of the layer. After imagewise exposure, the lithographic printing plate can be developed by washing out the unexposed, noncross-linked parts of the recording layer with the developer suitable for this purpose. Development can be carried out, for example, by washing, spraying, rubbing, brushing, etc. Preferred photosensitive recording elements for the production of lithographic printing plates are those which can be developed with aqueous alkaline developers, in general at a pH of from 8 to 14, preferably from about 9 to 13. The lithographic printing plates produced in this manner can, if desired, be after-treated in a conventional manner. In addition to drying of the said plate after development, the after-treatment may comprise uniform postexposure to actinic light or a heat treatment. The water-carrying regions of the surface of the lithographic printing plate thus produced may furthermore be rendered hydrophilic or gummed.

The Examples which follow illustrate the invention. Parts and percentages are by weight, unless stated otherwise. The parts by volume bear the same relation to parts by weight as that of the liter to the kilogram.

EXAMPLES 1 TO 5

10% strength solutions of a mixture of 91 parts of an ethylenically unsaturated, photopolymerizable oligomer, one part of Victoria Pure Blue B (C.I. 44,045), 2 parts of the particular compound (I) stated in Table 1 below and 6 parts of the particular compound (II) stated in Table 1 below were prepared in each case in a solvent mixture consisting of equal amounts of tetrahydrofuran and ethyl acetate. The ethylenically unsaturated, photopolymerizable oligomer was prepared by reacting 1 mole of bisphenol A bisglycidyl ether with 2 moles of acrylic acid and then reacting the resulting reaction product with 0.5 mole of hexamethylene diisocyanate with simultaneous chain extension, and reacting the free hydroxyl groups of the resulting urethane acrylate resin with 0.6 mole of phthalic anhydride. The homogeneous solutions were applied, by means of a knife coater (35 $\mu$m slot, 250 mm/min take-off speed), onto electrolytically roughened and anodically oxidized sheet aluminum bases, as typically used for lithographic printing plates. Drying was carried out for about 10 minutes at 80° C. in each case to give photopolymerizable layers which were 2.5 $\mu$m thick when dry (about 2.7 g/m$^2$). The lithographic printing plates thus prepared (without an oxygen barrier layer) initially remained for 6 days in a closed bag. Thereafter, they were exposed to actinic light through a FOGRA PMS test strip to determine the required minimum exposure time. After exposure, the plates were developed with a 1% strength aqueous soda solution (pH about 11) in the course of 45 seconds. The minimum exposure times and the resolution obtained with these plates are likewise shown in Table 1.

The above experiments were repeated, except that in this case an oxygen barrier layer consisting of polyvinyl alcohol (degree of hydrolysis about 98%) was applied as a 5 $\mu$m thick layer (about 6 g/m$^2$) onto the free surface of the photopolymerizable layer of the lithographic printing plates directly after drying. For these lithographic printing plates possessing an oxygen barrier layer, the required minimum exposure time and the achievable resolution were determined by imagewise exposure to actinic light through the FOGRA PMS test strip, in the same way as for the plates without an oxygen barrier layer. The results are likewise summarized in Table 1.

As shown in Table 1, the novel photopolymerizable mixtures require only short exposure times, and good resolution is also achieved. The results furthermore show that, in the novel photopolymerizable recording materials, oxygen has only a very small inhibiting effect on the photopolymerization, so that it is possible to dispense with oxygen barrier layers.

COMPARATIVE EXPERIMENT A

The procedure described in Example 1 was followed, except that in this case the addition of the compound (II) was dispensed with. The results are likewise shown in Table 1.

COMPARATIVE EXPERIMENT B

The procedure described in Example 1 was followed, except that in this case the addition of the compound (I) was dispensed with. The results are shown in Table 1.

COMPARATIVE EXPERIMENT C

The procedure described in Example 1 was followed, except that in this case the photopolymerizable mixture was prepared using 6 parts of benzophenone instead of compound (II). The values given in Table 1 show that, when an oxygen barrier layer is absent, the photoinitiator, Michler's ketone/benzophenone, requires very long exposure times compared with the novel mixture of Example 1, in which the initiator used was a combination of Michler's ketone and s-triazine. Although the use of a barrier layer makes it possible for the minimum exposure time for the photopolymerizable mixtures to be very greatly reduced when the initiator system Michler's ketone/benzophenone is employed, the resolving power of the photosensitive recording elements is greatly decreased as a result, so that fine image elements can no longer be reproduced exactly.

TABLE 1

| Example/comparative experiment | Compound (I) | Compound (II) | Minimum exposure time [sec] without barrier layer | Minimum exposure time [sec] with barrier layer | Still reproducible open gap (μm) without barrier layer | Still reproducible open gap (μm) with barrier layer |
| --- | --- | --- | --- | --- | --- | --- |
| 1 | Michler's ketone | 2-(p-methoxyphenyl)-4,6-bis-(trichloromethyl)-s-triazine | 8 | 7 | 12 | 15 |
| 2 | thioxanthone | 2-(p-methoxyphenyl)-4,6-bis-(trichloromethyl)-s-triazine | 18 | 16 | 15 | 20 |
| 3 | 2-chlorothioxanthone | 2-(p-methoxyphenyl)-4,6-bis-(trichloromethyl)-s-triazine | 13 | 11 | 15 | 20 |
| 4 | 4,4'-bis-morpholino-benzophenone | 2-(p-methoxyphenyl)-4,6-bis-(trichloromethyl)-s-triazine | 14 | 14 | 15 | 20 |
| 5 | 4,4'-bis-(β-hydroxy-ethylmethylamino)-benzophenone | 2-(p-methoxyphenyl)-4,6-bis-(trichloromethyl)-s-triazine | 9 | 8 | 12 | 15 |
| A | Michler's ketone | none | 120 | 75 | 20 | 40 |
| B | none | as for Example 1 | 25 | 18 | 30 | >40 |
| C | Michler's ketone | benzophenone | 40 | 1 | 10 | 30 |

EXAMPLE 6

A solution of 110 parts of a reaction product of 1 mole of butanediol diglycidyl ether and 2 moles of acrylic acid, 141 parts of a 70:30 methyl methacrylate/methacrylic acid copolymer, 65 mol % of whose copolymerized methacrylic acid units have been reacted with glycidyl methacrylate with formation of methacrylate side groups in the copolymer, 5.5 parts of Michler's ketone, 16.6 parts of 2-(4'-tert-butylstyryl)-4,6-bis-(trichloromethyl)-s-triazine and 2.5 parts of a blue dye in 2,500 parts by volume of tetrahydrofuran was prepared and was cast on an aluminum sheet, typically used for offset printing, in such a way that, after evaporation of the solvent and drying, the photopolymerizable recording layer having a bulk density of about 2.5 g/m² resulted. The lithographic printing plate thus obtained was stored, exposed image-wise and developed without an oxygen barrier layer, these steps being carried out as described in Example 1. The resolution obtained was very good. 6 μm wide lines and open gaps were reproduced without difficulty. The required minimum exposure time was 25 seconds. A lithographic printing plate of satisfactory quality was obtained.

EXAMPLE 7

The procedure described in Example 6 was followed, except that in this case, instead of the copolymer employed in Example 6, 141 parts of a 70:30 methyl methacrylate/methacrylic acid copolymer were used, 50 mol % of the carboxyl groups of this copolymer having been reacted with glycidyl acrylate with formation of acrylate side groups in the copolymer. Furthermore, 6 parts of 2-(2'-hydroxy-3'-methoxystyryl)-4,6-bis-(trichloromethyl)-s-triazine were used in this case as the s-triazine component for the photoinitiator. The results obtained were similar to those of Example 6.

EXAMPLE 8

Example 6 was repeated, except that in this case the amount of copolymer was increased to 155 parts and the amount of s-triazine compound was reduced to 8.3 parts. Furthermore, the s-triazine compound used in this case was 2-(2'-hydroxy-3'-methoxystyryl)-4,6-bis-(trichloromethyl)-s-triazine, and, after drying, the photosensitive recording layer was provided with a polyvinyl alcohol top layer about 2 μm thick. The minimum exposure time in this case was only 17 seconds; inspite of the fct that a top layer was used, 12 μm lines and gaps were reproduced satisfactorily.

EXAMPLES 9 TO 13

Example 6 was repeated, the components for the photoinitiator being varied. The photoinitiator components used in the individual examples are shown in Table 2. The results obtained (minimum exposure times, resolving power) are likewise given in Table 2. As can be seen from this Table, very good resolution was obtained in all cases during comparatively short exposure times.

TABLE 2

| Example | Photoinitiator Component a | Photoinitiator Component b* | Minimum exposure time [sec] | Still reproducible isolated lines or open gaps [μm] |
| --- | --- | --- | --- | --- |
| 9 | Michler's ketone | 2-(4'-tert-butoxystyryl)- | 20 | 15 |
| 10 | Michler's ketone | 2-(4'-allyl-oxystyryl)- | 35 | 12 |
| 11 | Michler's ketone | 2-(2'-hydroxy-styryl)- | 30 | 8 |
| 12 | Michler's ketone | 3-(3',4'-methy-lenedioxostyryl)- | 20 | 6 |
| 13 | benzo-suberone | 2-(p-methoxy-phenyl)- | 30 | 6 |

*component b in each case is a 4,6-bis-(trichloromethyl)-s-triazine compound, and the substituent in the 2-position was changed in each case, as shown.

EXAMPLE 14

55 parts of a styrene/maleic half ester copolymer (Scripset ® 540 from Monsanto), 40 parts of trimethylolpropane triacrylate, 1 part of Victoria Blue, 2 parts of 4,4'-bis-(dimethylamino)-benzophenone and 3 parts of 2-(3'-methoxy-4'-hydroxystyryl)-4,6-bis-(trichloromethyl)-s-triazine were dissolved in 900 parts of tetrahydrofuran. This solution was used to coat an electrolytically roughened and anodically oxidized sheet aluminum base in such a way that, after drying for 5 minutes at 75° C., the thickness of the resulting dry photopolymerizable layer was 1.8 μm (about 2 g/m²). The lithographic printing plate produced in this manner had no oxygen barrier layer and was exposed imagewise in a commercial offset exposure unit; it was then developed with an aqueous alkali solution. The minimum exposure time for this lithographic printing plate was 70 seconds. It was possible for lines and open gaps having a width of only 8 μm to be reproduced satisfactorily and without difficulties.

EXAMPLE 15

The procedure described in Example 6 was followed, except that 2-(2'-hydroxy-4'-methoxystyryl)-4,6-bis-(trichloromethyl)-s-triazine was used instead of 2-(4'-tert-butylstyryl)-4,6-bis-(trichloromethyl)-s-triazine. The lithographic printing plates produced using this triazine derivative possessed an excellent shelf life. No crystallization at all was observed, even after storage for one year. Further processing of the lithographic printing plates gives satisfactory lithographic printing forms.

We claim:
1. A photopolymerizable mixture consisting essentially of
   (i) from 5 to 99.5% by weight, based on the photopolymerizable mixture, of one or more ethylenically unsaturated, photopolymerizable compounds selected from the group consisting of monomers of a molecular weight of less than 1,000; oligomers of a mean molecular weight (number average) of from about 1,000 to about 10,000; and polymers of a mean molecular weight (number average) of from about 10,000 to about 250,000; said monomers, oligomers and polymers all containing one or more photopolymerizable double bonds;
   (ii) from 0.5 to 15% by weight based on the photopolymerizable mixture, of a photopolymerization initiator consisting essentially of
      (a) from 0.1 to 5% by weight, based on the photopolymerizable mixture, of one or more compounds of the formula (I)

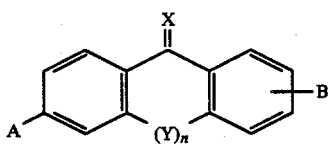

(I)

where A and B are —$NR^1R^2$, wherein $R^1$ and $R^2$ are identical or different and independently of one another are each hydrogen or an unsubstituted or substituted aliphatic, aromatic or mixed aliphatic-aromatic radical, X is oxygen, sulfur or =$NR^4$, wherein $R^4$ is hydrogen or an aliphatic, aromatic or mixed aliphatic-aromatic radical, Y is a direct bond or a —$CH_2$—, —$CH_2$—$CH_2$—, —O—, —S—, —C(O)— or $NR^5$ wherein $R^5$ is hydrogen or an aliphatic or aromatic radical and n is 0 or 1, and
      (b) from 0.4 to 10% by weight, based on the photopolymerizable mixture, of one or more compounds of the formula (II)

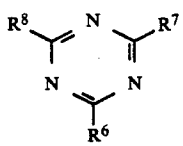

(II)

where $R^6$, $R^7$ and $R^8$ are identical or different and are each unsubstituted or substituted alkyl, unsubstituted or substituted aryl or unsubstituted or substituted aralkyl, and one or more of the radicals $R^6$, $R^7$, and $R^8$ are monohalogen-, dihalogen- or trihalogen-substituted methyl and one of the radicals $R^6$, $R^7$, or $R^8$ may furthermore be unsubstituted or substituted alkenyl or —$NR_2$, —OR— or —SR—, where R in each case is hydrogen, alkyl or aryl, the weight ratio of compounds of the formula (I) to the compounds of the formula (II) in the polymerizable mixture being from 10:90 to 40:60; and
   (iii) from 0 to 90% by weight, based on the photopolymerizable mixture, of a film-forming non-photopolymerizable polymeric binder.
2. The photopolymerizable mixture of claim 1, wherein, in the formula (I), X is oxygen.
3. The photopolymerizable mixture of claim 2, wherein, in the formula (I), n is 0.
4. The photopolymerizable mixture of claim 3, wherein $R^1$ and $R^2$ can be identical or different and are each alkyl of 1 to 4 carbon atoms or hydroxyalkyl of 2 or 3 carbon atoms, or together constitute an alkylene group of 4 or 5 carbon atoms and form a heterocyclic ring.
5. The photopolymerizable mixture of claim 1, wherein, in the formula (I), n is 1 and Y is —O—, —S— or —C(O)—.
6. The photopolymerizable mixture of claim 5, wherein, in formula (I), X ix oxygen.
7. The photopolymerizable mixture of claim 1, wherein, in the formula (II), $R^6$ is monohalogen-, dihalogen- or trihalogen-substituted methyl.
8. The photopolymerizable mixture of claim 7, wherein, in the formula (II), $R^7$ is monogalogen-, dihalogen- or trihalogen-substituted methyl.
9. The photopolymerizable mixture of claim 8, wherein, the formula (II), $R^8$ is styryl of the formula

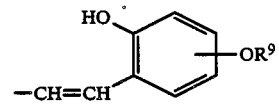

wherein $R^9$ is hydrogen, alkyl or aryl.
10. The photopolymerizable mixture of claim 9, wherein the compound of the formula (II) is 2-(2'-hydroxy-4'-ethoxystyryl)-4,6-bis-(trichloromethyl)-s-triazine.
11. The photopolymerizable mixture of claim 7, wherein, in the formula (II), $R^8$ is unsubstituted or substituted aryl.
12. The photopolymerizable mixture of claim 1, wherein the compound of the formula (I) is benzophenone or a benzophenone derivative.
13. The photopolymerizable mixture of claim 1, wherein the compound of the formula (I) is thioxanthone or a thioxanthone derivative.
14. The photopolymerizable mixture of claim 1, wherein the compound of the formula (II) is a 2-aryl-4,6-bis-(trichloromethyl)-s-triazine.
15. The photopolymerizable mixture of 1, wherein the photopolymerizable mixture consists essentially of from 0.5 to 15% by weight of said photopolymerization initiator, from 8 to 65% by weight of one or more ethylenically unsaturated photopolymerizable monomers, from 30 to 90% by weight of said one or more nonphotopolymerizable polymeric binders and from 0 to 25% by weight of said additives or assistants.

16. The photopolymerizable mixture of claim 1, wherein the photopolymerizable mixture consist essentially of 0.5 to 15% by weight of said photopolymerization initiator from 70 to 99.5% by weight of one or more ethylenically unsaturated photopolymerizable oligomers having a mean molecular weight (number average) of from 1,000 to 10,000 and containing free carboxyl groups and 2 or more acryloyl and/or methacryloyl groups, from 0 to 10% by weight of said one or more ethylenically unsaturated, photopolymerizable monomers, from 0 to 10% by weight of said one or more nonphotopolymerizable polymeric binders, and from 0 to 10% by weight of said additives or assistants.

17. The photopolymerizable mixture of claim 16, wherein the ethylenically unsaturated, photopolymerizable oligomers are oligomeric (meth)acryloyl-containing urethane resins.

18. The photopolymerizable mixture claim 1, wherein the photopolymerizable mixture consists essentially of from 0.5 to 15% by weight of said photopolymerization initiator from 75 to 95.5% by weight of said ethylenically unsaturated, photopolymerizable compounds and from 0 to 10% by weight of said additives or assistants, wherein said ethylenically unsaturated, photopolymerizable compounds consist of one or more ethylenically unsaturated, photopolymerizable monomers and one or more photopolymerizable polymers wherein the weight ratio of photopolymerizable monomer to photopolymerizable polymer is from 1:15 to 1:1.

19. The photopolymerizable mixture of claim 7, wherein $R^6$ is trichloromethyl or tribromomethyl.

20. The photopolymerizable mixture of claim 8, wherein $R^7$ is trichloromethyl or tribromomethyl.

21. The photopolymerizable mixture of claim 12, wherein the compound of formula (I) is a benzophenone derivative, said benzophenone derivative being Michler's ketone, and the compound of the formula (II) is trichloromethyl-s-triazine.

22. The photopolymerizable mixture of claim 13, wherein said compound of the formula (I) is a thioxanthone derivative, said thioxanthone derivative being 2-chlorothioxanthone.

23. The photopolymerizable mixture of claim 17, wherein said oligomeric (meth)acryloyl-containing resins are prepared by reacting (meth)acryloyl-containing diol or polyol compounds with a diisocyanate, in the presence or absence of low molecular weight diols as chain extenders, with conversion of some of the hydroxyl groups of the diol or polyol components and formation of a hydroxide-containing oligomeric urethane resin, and then reacting some or all of the free hydroxyl groups still present in the urethane resin with a cyclic dicarboxylic anhydride with formation of the acidic partial ester of the dicarboxylic acid.

* * * * *

UNITED STATES PATENT AND TRADEMARK OFFICE
CERTIFICATE OF CORRECTION

PATENT NO. : 4,935,330

DATED : June 19, 1990

INVENTOR(S) : Gerhard HOFFMANN et al.

It is certified that error appears in the above-identified patent and that said Letters Patent is hereby corrected as shown below:

ON THE COVER PAGE

Inventors "Gerhard Hofmann" and "Reiner Hoffmann" should read

--Gerhard Hoffmann-- and --Reiner Hofmann--

Serial number "61,859" should read --061,859--

Column 22, Line 3

"hydroxy-4'-ethoxystyryl)" should read

--hydroxy-4'-methoxystyryl)--

Signed and Sealed this

Tenth Day of September, 1991

Attest:

HARRY F. MANBECK, JR.

Attesting Officer

Commissioner of Patents and Trademarks